United States Patent [19]

Mazura et al.

[11] Patent Number: 5,034,853
[45] Date of Patent: Jul. 23, 1991

[54] HOUSING, PARTICULARLY A MODULE CARRIER, INCLUDING SUPPORTING RAILS FOR ACCOMODATING A PLURALITY OF MUTUALLY PARALLEL GUIDE RAILS

[75] Inventors: Paul Mazura, Karlsbad-Spielberg; Werner F. Sonnabend, Straubenhardt; Hans-Ulrich Günther, Pfinztal, all of Fed. Rep. of Germany

[73] Assignee: Schroff GmbH, Straubenhardt, Fed. Rep. of Germany

[21] Appl. No.: 423,046

[22] Filed: Oct. 18, 1989

[30] Foreign Application Priority Data

Oct. 31, 1988 [DE] Fed. Rep. of Germany ....... 3837029

[51] Int. Cl.$^5$ .............................................. H05K 7/16
[52] U.S. Cl. .................................... 361/391; 361/379; 361/380; 361/381; 361/383; 361/389; 361/399; 361/415; 211/41; 439/485
[58] Field of Search ............................ 174/16.1, 255; 165/80.3; 361/383, 384, 386, 388, 391, 393, 389, 394, 399, 412, 413, 419, 415; 439/59, 64, 68, 76, 79, 185, 260, 267, 485

[56] References Cited

U.S. PATENT DOCUMENTS

| 4,201,303 | 5/1980 | Smith | 211/41 |
| 4,862,320 | 8/1989 | Schmidt et al. | 165/80.3 |
| 4,894,749 | 1/1990 | Elko et al. | 361/415 |

FOREIGN PATENT DOCUMENTS

| 7022179 | 3/1971 | Fed. Rep. of Germany . |
| 7623320 | 2/1977 | Fed. Rep. of Germany . |
| 7639989 | 3/1977 | Fed. Rep. of Germany . |
| 3209205 | 9/1983 | Fed. Rep. of Germany . |
| 3408073 | 9/1985 | Fed. Rep. of Germany . |
| 5594353 | 2/1982 | Japan | 361/384 |

Primary Examiner—Leo P. Picard
Assistant Examiner—Donald A. Sparks
Attorney, Agent, or Firm—Spencer & Frank

[57] ABSTRACT

The present invention relates to housings, particularly module carriers, equipped with supporting rails for the accommodation of a plurality of mutually parallel guide rails into which plug-in units equipped with electronic and electric components can be inserted. According to the invention, unoccupied plug-in locations are covered by individual covers whose width essentially corresponds to a multiple of the smallest scale unit and which can be combined in any desired number so that the air flow in the housing or in the module carrier is improved in a simple manner.

18 Claims, 2 Drawing Sheets

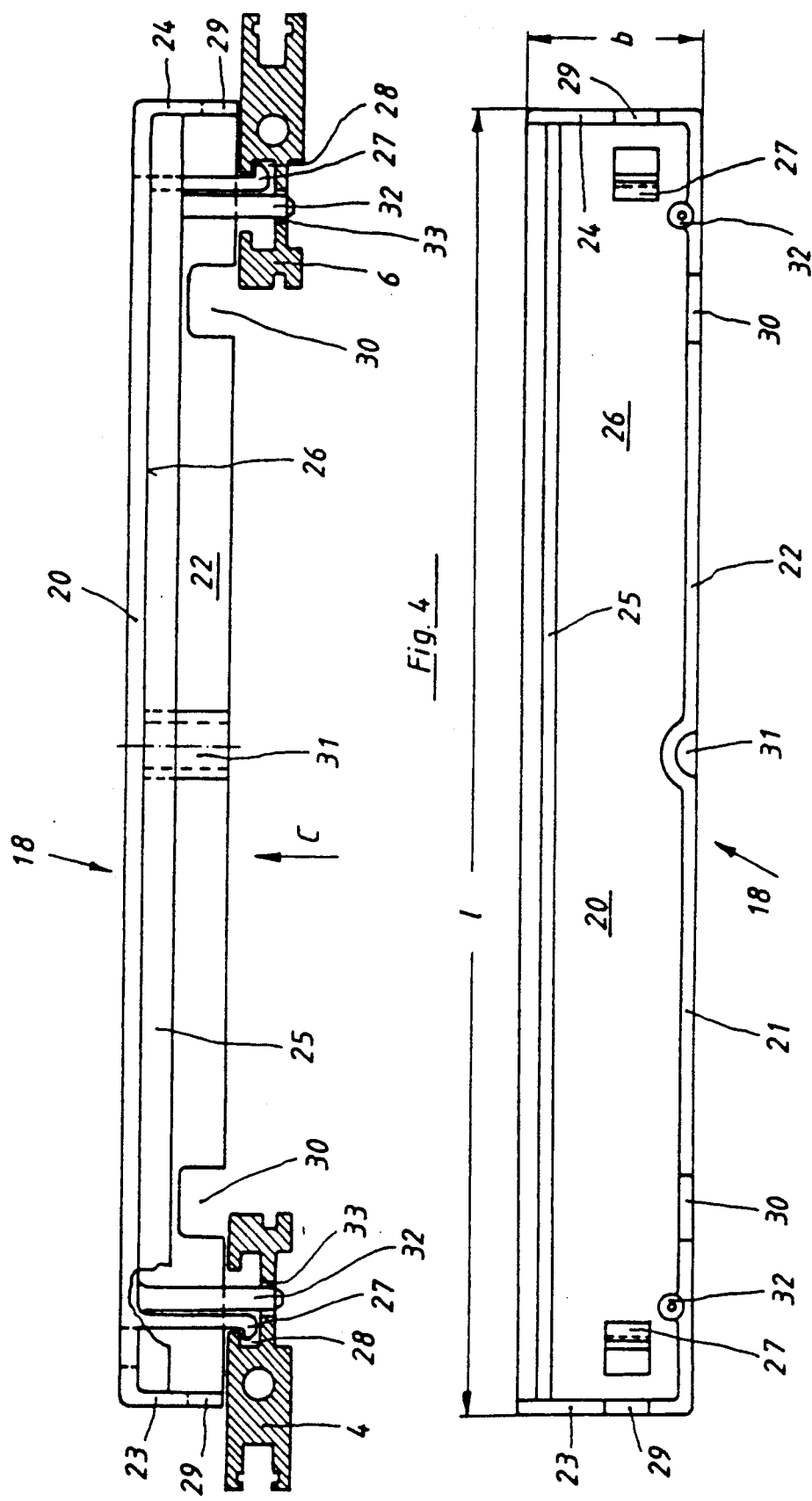

HOUSING, PARTICULARLY A MODULE CARRIER, INCLUDING SUPPORTING RAILS FOR ACCOMODATING A PLURALITY OF MUTUALLY PARALLEL GUIDE RAILS

CROSS REFERENCE TO RELATED APPLICATION

This application claims the priority of Application Ser. No. P 38 37 029.8, filed Oct. 31, 1988, in the Federal Republic of Germany, the subject matter of which is incorporated herein by reference.

BACKGROUND OF THE INVENTION

The present invention relates to housings, particularly module carriers, including supporting rails to accommodate a plurality of mutually parallel guide rails in which plug-in units can be inserted which are equipped with electronic and electrical components, with unoccupied plug-in locations being covered by a covering.

In housings, particularly module carriers, for plug-in units which are equipped with electronic and electric components, it is necessary to carry away the heat discharged by the components. This heat can be carried away by natural convection, possibly supported by blowers, heat exchangers or cooling devices. In any case, it is important for the incoming air to flow as closely as possible along the circuit boards equipped with the components. If not all plug-in locations are occupied, a less favorable flow of air results for the inserted plug-in components than would be the case if all of the plug-in locations were occupied. The reason for this is the more favorable flow resistances of the unoccupied spaces compared to the spaces occupied by plug-in units.

It is already known to consider the above-described problems by covering the unoccupied plug-in locations with the aid of appropriately shaped fixed cover plates. However, such fixed cover plates are relatively expensive special components which must be manufactured especially for the respective application. Subsequent changes of the plug-in location occupation pattern are rather expensive to accomplish and generally require the installation of matching cover plates.

SUMMARY OF THE INVENTION

Based on the above-described prior art, it is the object of the invention to provide a housing, particularly a module carrier, equipped with supporting rails for accommodating a plurality of mutually parallel guide rails, with the covering of unoccupied plug-in locations being configured in such a way that it can be used with different types of plug-in location occupation patterns and can also be adapted inexpensively to changes in plug-in location occupation.

This is accomplished, according to the present invention, in that the covering is composed of individual covers whose width corresponds essentially to a multiple of the smallest scale unit and which can be combined in any desired number.

According to the invention, the covering of unoccupied plug-in locations is thus not effected by fixed cover plates whose dimensions are adapted specifically to the respective case of use but with the aid of individual covers that can be combined in any desired number. Depending on the number of unoccupied plug-in locations, a corresponding number of individual covers are employed. The width of the individual covers is essentially a multiple of the smallest scale unit. For most cases, it should be sufficient to employ individual covers having a width of four scale units. In the 19" plug-in art (DIN 41,494) one scale unit is 5.08 mm so that the width may be, for example, 20 mm. However, individual covers of a width of, for example, three or five scale units may also be employed. If necessary, a combination of individual covers of different widths may also be appropriate. In any case, the covering is produced by means of standardized individual covers so that it can easily be adapted to subsequently changed plug-in location occupations.

Advisably, the individual covers may be fixed to the supporting rails so that the individual covers can also be employed if different guide rails are used and in the absence of individual guide rails.

In principle, various types of fastening are possible. It is of particular advantage if each individual cover is secured to the supporting rails by means of at least two oppositely oriented spring catches, so that no tools whatsoever are required for assembly. Preferably, the spring catches engage in undercut grooves of the supporting rails. Advisably, the individual covers are configured in such a way that the spring catches permit destruction-free disassembly so as to enable the individual covers to be used repeatedly.

Regarding their length, the individual covers are adapted to the depth of the plug-in units, i.e. if plug-in units of varying depth can be employed within one housing or one component carrier, it may be necessary to employ individual covers of several length dimensions.

According to further advantageous features of the invention, the individual covers each include an upper wall whose width essentially corresponds to a multiple of the smallest scale unit and whose length is adapted to the depth of the plug-in units, a side wall projecting perpendicularly from the longitudinal side of the upper wall as well as front and rear walls, likewise projecting perpendicularly from the upper wall. The above-mentioned inventive measures ensure a functional and form-stable configuration of the individual covers. In this case, the spring catches may be disposed at the underside of the upper wall. If the front and rear walls are provided with openings for the passage of a tool, this creates the possibility for particularly easy disassembly.

In order to further improve the positional stability of the individual covers and to ensure that the respective individual covers must definitely be removed before an additional plug-in unit is subsequently inserted, the individual covers according to the invention may be configured so that they can be plugged onto unoccupied guide rails. For this purpose, a guide strip for engagement in an unoccupied guide rail may be disposed at the underside of the upper wall.

Often guide rail grates are employed instead of individual guide rails. In such guide rail grates, the individual guide rails are connected into a structural unit by way of connecting webs. In order to be able nevertheless to attach individual covers to unoccupied plug-in locations, it is of advantage to provide the side wall of the individual covers with open-edge perforations for the passage of the connecting webs. Since, for manufacturing reasons, guide rail grates generally are equipped with projections for ejection from the injection mold, it is advisable to equip the individual covers with corresponding recesses to accommodate these ejection projections.

The exact placement of the individual covers during assembly is facilitated considerably if, according to the invention, the covers are provided with guide pins. These guide pins engage in openings which are provided in the supporting rails at the spacing of the smallest scale unit and may also be disposed on the underside of the upper wall.

Particularly easy and relatively economical in manufacture are individual covers in the form of cast plastic members. The preferred material is a plastic material belonging to flameproof class UL 94 VO.

A particularly preferred embodiment of the invention results if the housing is equipped at its rear with at least one cover plate disposed behind the plug-in units. Such cover plates may be formed, for example, of mother boards. The combination of the individual covers according to the invention with such mother boards results in a particularly favorable air flow and thus cooling of the existing plug-in units.

Particularly for housings and component carriers equipped with mother boards, it sometimes happens that plug-in locations not occupied by functional plug-in units are covered with plug-in units equipped with blank circuit boards, i.e. circuit boards not equipped with electronic or electrical components. In order to utilize the air flowing uselessly past these blank circuit boards to cool the functional plug-in units, it is proposed, according to a further embodiment of the invention, to attach individual covers directly to the blank circuit board. The individual covers employed in this connection may be configured as angle profiles, with one arm fastened to the blank circuit board and the other serving as covering arm.

According to further features of the invention, the rear sides of blank circuit boards equipped with individual covers may be provided with plug-in connectors with which the blank boards can be coupled to a mother board if required. In this way, the blank board, on the one hand, has a firm seat in the housing or component carrier and, on the other hand, is able to take over, if required, additional functions, e.g. the connection of contact pins with the mother board.

BRIEF DESCRIPTION OF THE DRAWINGS

The present invention will now be described in greater detail with reference to embodiments thereof that are illustrated in the drawing figures.

FIG. 3 is a view in the direction indicated by arrow B of FIG. 2 of an individual cover according to the invention.

FIG. 4 is a view in the direction indicated by arrow C of FIG. 3 of the individual cover according to the invention (without supporting rails).

DETAILED DESCRIPTION OF THE PREFERRED EMBODIMENTS

Figure 1:
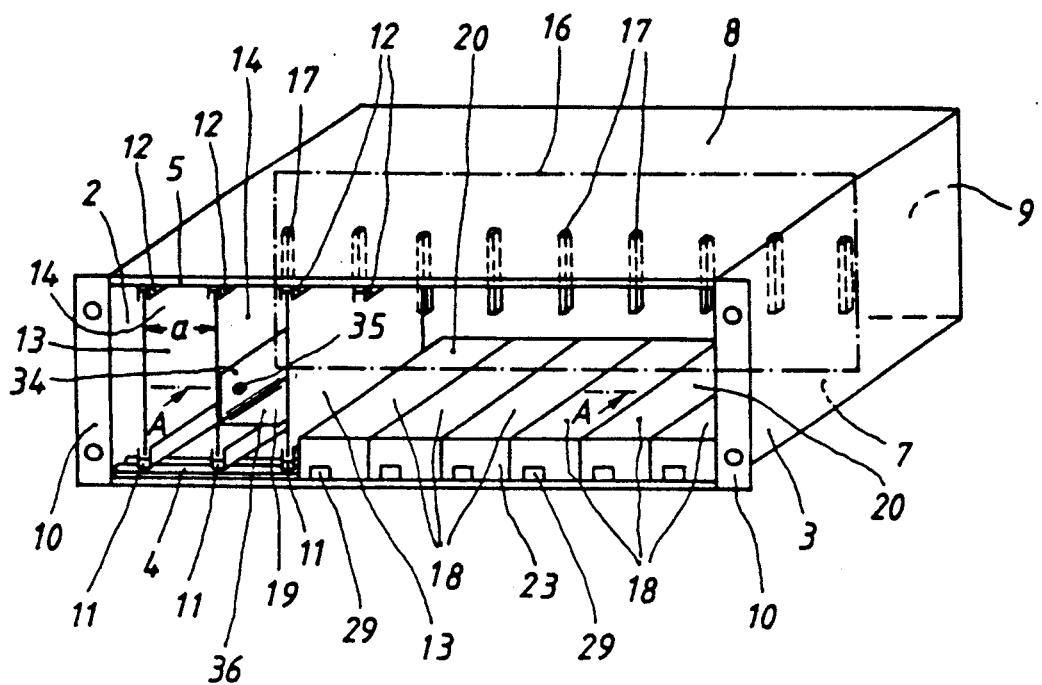
FIG. 1 is an isometric, highly schematic view of a housing according to the invention.
Figure 2:
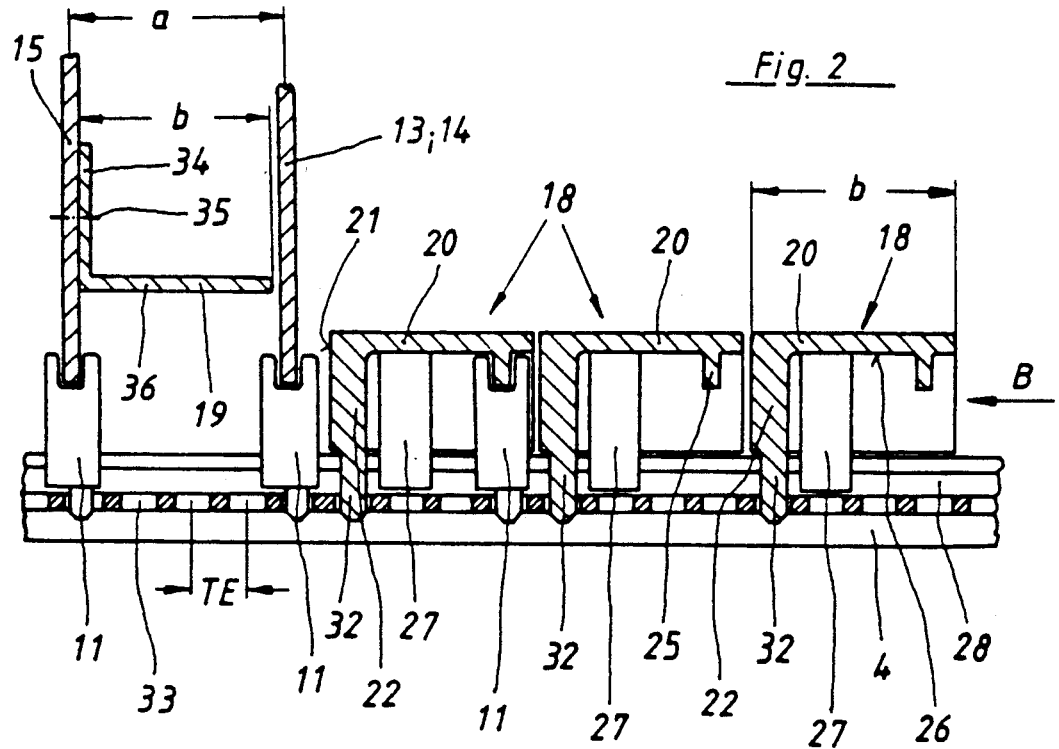
FIG. 2 is an enlarged partial sectional view along line A—A of FIG. 1 of a housing according to the invention.

The disclosed embodiment includes a component carrier 1 which may be configured as a stand-alone housing or as an insertable unit for a higher-order housing, e.g. a cabinet. The component carrier 1, particularly as shown in FIG. 1, is essentially composed of two side walls 2 and 3, two front supporting rails 4 and 5 and an upper and a lower supporting rail 6 in the rear region. In the case where component carrier 1 is used as a stand-alone housing, it is additionally provided with a lower metal covering sheet 7 and an upper metal covering sheet 8 as well as a rear plate 9. Flanges 10 projecting at a right angle from the front may be disposed at side walls 2 and 3 for fastening component carrier 1 in a higher-order housing.

On the left side, component carrier 1 is provided with four lower guide rails 11 (only three are illustrated) and four upper guide rails 12. Guide rails 11 and 12 are arranged parallel to one another at a distance in which is a multiple of the smallest scale unit TE and are secured to guide rails 5 and 6. The first and third guide rails 11 and 12, respectively, are occupied by plug-in units 13 whose circuit boards 14 are equipped with electronic and electric components (not shown) and constitute what is referred to as plug-in function units. A blank circuit board 15 not equipped with components is inserted into second guide rails 11 and 12. The fourth guide rails 11 and 12 are not occupied by a plug-in unit 13. The other plug-in locations are also unoccupied. On the rear, behind plug-in units 13, there is a cover plate 16 in the form of a mother board which is equipped with plug-in connectors 17 into which circuit boards 14 and blank boards 15 can be snapped in order to coordinate he electrical functions of individual plug-in units 13 with one another.

Since the components of the plug-in function units emit heat due to their power dissipation, it is necessary to cool them. This is generally done by a stream of air which, due to natural convection, possibly assisted by technical aids, flows from the bottom to the top through module carrier 1. In this connection, it is of advantage if only those plug-in units 13 lie in the stream of air whose circuit boards 14 are equipped with components while the air flow is blocked in favor of the function units at the plug-in locations not occupied by function units.

For this purpose, the unoccupied plug-in locations are covered by individual covers 18 or 19. These individual covers 18, 19 have a width b which essentially corresponds to a multiple of a scale unit TE and which can be combined in any desired number. With respect to their length l, individual covers 18, 19 are adapted to the depth of a plug-in unit. Individual covers 18 are plastic injection molded components, with a plastic material of flameproof class UL 94 VO being employed and each includes an upper wall 20, a side wall 2 extending perpendicularly to the longitudinal side 21 of upper wall 20 as well as front walls 23 and rear walls 24, likewise extending in a direction perpendicular to upper wall 20. A guide strip 25 for engagement in an unoccupied guide rail 12 is shaped to the underside 26 of upper wall 20 and serves to ensure that the respective individual cover 18 is removed before an additional plug-in unit 13 is subsequently installed.

Individual covers 18 are secured to guide rails 11 with the aid of spring catches 27 which engage in undercut grooves 28 in supporting rails 4 and 6. Spring catches 27 are configured in such a way that they permit destruction-free disassembly. Such disassembly is facilitated by openings 29 in front wall 23 and in rear wall 24 for the passage of a tool, e.g. a screwdriver.

Open-edge passages 30 are disposed in the side walls 22 of individual covers 18. If instead of individual guide rails 11, guide rail grates are employed, the connecting webs of the guide rail grate are placed into these passages 30 and do not interfere with the installation of the individual covers 18. Recesses 31 serve the same purpose in that the ejection attachments of a guide rail grate resulting from its manufacture are able to engage therein.

In order to be able to place the individual covers 18 accurately in supporting rails 4 and 6, the latter are equipped with guide pins 32 which are disposed at the underside 26 of upper wall 20 and are partially integrated in side wall 22. Guide pins 32 engage in openings 33 provided in guide rails 4, 5 and 6 at the spacing of the smallest scale unit TE.

It may be necessary to insert an unoccupied guide rail 11, 12 into a blank circuit board 15, for example to couple together certain contacts at the plug-in connection 17 of cover plate 16 which is configured as the mother board. In this case, an individual cover 19 in the form of an angle profile may be attached, according to the invention, to the blank board to prevent the air from flowing unnecessarily along the blank board 15. The angle profile has its vertical arm 34 fastened to blank board 15, for example by means of a rivet 35. The horizontal arm 36 is configured as a covering arm. The blank circuit boards 15 and their individual covers 19 can be combined in any desired number in the same manner as individual covers 18.

It will be understood that the above description of the present invention is susceptible to various modifications, changes and adaptations, and the same are intended to be comprehended within the meaning and range of equivalents of the appended claims.

What is claimed is:

1. In a housing, particularly a module carrier, including supporting rails to accommodate a plurality of mutually parallel guide rails into which plug-in units having electronic and electrical components can be inserted; and a covering arranged to cover unoccupied plug-in locations; the improvement wherein the covering is composed of individual covers securable to the supporting rails; the covers having a width essentially corresponding to a multiple of the smallest scale unit; said covers being combinable in any desired number; each cover having an upper wall, a side wall, a front wall and a rear wall; each cover being individually securable to the supporting rails by means of at least two mutually oppositely oriented spring catches disposed under the upper wall; further wherein said front wall and said rear wall is provided with recesses for the passage of a tool to disassemble a selected said cover.

2. A housing as defined in claim 1, wherein the spring catches engage in undercut grooves in the supporting rails.

3. A housing as defined in claim 1, wherein the spring catches have such a configuration that they permit destruction-free disassembly.

4. A housing as defined in claim 1, wherein, with respect to their length, the individual covers are adapted to the depth of a plug-in unit.

5. A housing as defined in claim 1, wherein each upper wall has a width corresponding essentially to a multiple of the smallest scale unit and whose length is adapted to the depth of the plug-in unit; each side wall projecting perpendicularly from the longitudinal side of said upper wall; each front and rear wall projecting perpendicularly from a respective said upper wall.

6. A housing as defined in claim 1, wherein the individual covers can be placed onto unoccupied guide rails.

7. A housing as defined in claim 5, further comprising a guide strip for engagement in an unoccupied guide rail; said guide strip being disposed under the upper wall of each cover.

8. A housing as defined in claim 5, wherein the side wall is provided with open-edge perforations for the passage of connecting webs of a guide rail grate.

9. A housing as defined in claim 8, wherein at least one of said upper wall and said side wall is provided with additional recesses for the accommodation of ejection projections of a guide rail grate.

10. A housing as defined in claim 1, wherein the individual covers have guide pins for engagement in openings in the supporting rails, said openings being spaced at the distance of the smallest scale unit.

11. A housing as defined in claim 10, wherein the guide pins are disposed under the upper wall.

12. A housing as defined in claim 1, wherein the individual covers are plastic cast members.

13. A housing as defined in claim 1, wherein the housing is provided with at least one cover plate disposed on a rear side of the housing behind the plug-in units.

14. A housing as defined in claim 13, wherein a mother board forms the cover plate.

15. A housing as defined in claim 1, wherein one of the individual covers is disposed at a blank circuit board which is not occupied by components in the plug-in unit.

16. A housing as defined in claim 15, wherein said one individual cover is configured as an angle profile, with one arm thereof being fastened to the blank circuit board and the other arm being configured as a covering arm.

17. A housing as defined in claim 15, wherein the blank circuit board space is provided with at least one plug-in connector on a rear side thereof.

18. A housing as defined in claim 13, wherein a blank circuit board can be coupled to the mother board by way of plug-in connector.

* * * * *